United States Patent [19]

Matsuda et al.

[11] Patent Number: 5,514,243
[45] Date of Patent: May 7, 1996

[54] DRY ETCHING APPARATUS

[75] Inventors: Izuru Matsuda, Takatsuki; Masaki Suzuki, Hirakata, all of Japan

[73] Assignee: Matsushita Electric Industrial Co., Ltd., Osaka, Japan

[21] Appl. No.: 364,106

[22] Filed: Dec. 27, 1994

[30] Foreign Application Priority Data

Dec. 28, 1993 [JP] Japan .................... 5-335720

[51] Int. Cl.[6] .................................. H01L 21/00
[52] U.S. Cl. .................... 156/345; 156/643.1; 216/67
[58] Field of Search .................... 156/345 P, 643.1; 204/298.31, 198.34; 216/67

[56] References Cited

U.S. PATENT DOCUMENTS 5,272,417  12/1993  Ohmi ................... 204/298.34

FOREIGN PATENT DOCUMENTS 6-204180  7/1994  Japan .
6-232243  8/1994  Japan .
6-224287  8/1994  Japan .

*Primary Examiner*—William Powell
*Attorney, Agent, or Firm*—Wenderoth, Lind & Ponack

[57] ABSTRACT

A dry etching apparatus includes a first electrode provided with means for controlling a temperature of a to-be-etched member, a second electrode disposed facing in parallel to the first electrode, a vacuum container housing the first and second electrodes therein, a device for feeding etching gas into the vacuum container, and a device for impressing a high frequency power between the first and second electrodes. A surface of the first electrode to be in touch with both the to-be-etched member and the etching gas and to which the high frequency power is impressed is coated with an insulating film of volume resistivity $\rho$ within a range: $1\times10^8 \Omega\text{cm} \leq \rho < 1\times10^9 \Omega\text{cm}$.

8 Claims, 4 Drawing Sheets

DRY ETCHING APPARATUS

BACKGROUND OF THE INVENTION

The present invention relates to a dry etching apparatus for minutely processing patterns of semiconductor circuits or the like.

Plasma etching as a way of dry etching has been often carried out in process of manufacturing semiconductor devices in recent years.

A conventional dry etching apparatus will be depicted hereinbelow. FIG. 4 diagrammatically indicates an example of a reactive ion etching apparatus. The dry etching apparatus in FIG. 4 is provided with an upper electrode 2 and a lower electrode 3 in a vacuum chamber 1 via an insulating member 4. The lower electrode 3 is maintained at a constant temperature by a water-circulating type of temperature control device 5 through the circulation of water in an internal passage 6. A high frequency power source 8 is connected to the lower electrode 3 via an impedance matching circuit 7, bringing about plasma between the electrodes 2, 3.

Etching gas is introduced into the vacuum chamber 1 from a steel gas cylinder 9 through a valve 10 and a mass flow controller 11, which is discharged out by a vacuum pump 12. The pressure inside the vacuum chamber 1 is kept constant by a pressure controller 13.

More specifically, a predetermined etching gas is fed from the steel gas cylinder 9 through the valve 10 and the mass flow controller 11 into the vacuum chamber 1 in a direction of an arrow. When a high frequency power from the high frequency power source 8 is applied to the lower electrode 3, the etching gas is turned into the plasmic state. The etching gas in the plasmic state etches a to-be-etched member 14 disposed on the lower electrode 3.

The lower electrode 3 in the above conventional dry etching apparatus is schematically shown in a diagram in FIG. 5. The lower electrode is one disclosed in Japanese Laid-open Patent publication No. 6-204180. A surface of an aluminum base 3a of the lower electrode 3 to which the member 14 is to be attracted by the electrostatic force is coated with a film 3b of aluminum oxide. Meanwhile, the other surfaces of the aluminum base 3a which would come into contact with the etching gas are coated with an alumina ceramic 3c. A passage 6 for cooling medium is formed inside the lower electrode 3 so as to control the temperature of the to-be-etched member 14.

In the constitution as above, a semiconductor wafer 14 as the to-be-etched member is placed on the lower electrode 3 as indicated in FIG. 4. A high frequency power is applied between the electrodes 2, 3 while the etching gas is fed. At this time, the surface of the semiconductor wafer 14 is charged with negative electricity as a result of the cathode potential drop. In consequence, the lower electrode 3, specifically, aluminum oxide coating 3b is polarized, whereby an electrostatic attraction force is generated between the lower electrode 3 and the semiconductor wafer 14, thereby attracting the semiconductor wafer 14 to the lower electrode 3. In this 10 manner, while the semiconductor wafer 14 is maintained at a constant temperature close to the temperature of the lower electrode 3, plasma etching is carried out.

In the conventional method described hereinabove, the volume resistivity of the aluminum oxide coating 3b of the lower electrode 3 is $1 \times 10^{12}$ through $1 \times 10^{13} \Omega cm$ in the etching process. Thus, it is difficult to remove the charged electricity from the coating 3b. Therefore, the amount of charge on the surface of the semiconductor wafer 14 is increased as the etching proceeds. As a result, the obtained semiconductor device may be broken subsequent to the electrical discharge as it the coating 3b is increasingly charged, or the electrostatic attraction force remaining even after etching may cause difficulties in transferring the wafer.

SUMMARY OF THE INVENTION

The object of the present invention is therefore to provide an apparatus for producing semiconductor devices without damaging the devices or causing troubles in transferring the wafers duct to the remaining electrostatic attraction force, while controlling the temperature of semiconductor wafers by the electrostatic attraction force.

In accomplishing this object, according to one aspect of the present invention, there is provided a dry etching apparatus comprising:

a first electrode provided with means for controlling a temperature of a to-be-etched member;

a second electrode disposed facing in parallel to the first electrode;

a vacuum container housing the first and second electrodes therein;

means for feeding etching gas into the vacuum container; and means for impressing a high frequency power between the first and second electrodes, wherein a surface of the first electrode to be in touch with both the to-be-etched member and the etching gas and to which the high frequency power is impressed is coated with an insulating film of volume resistivity p within a range: $1 \times 10^8 \Omega cm \leq \rho < 1 \times 10^9 \Omega cm$.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1:
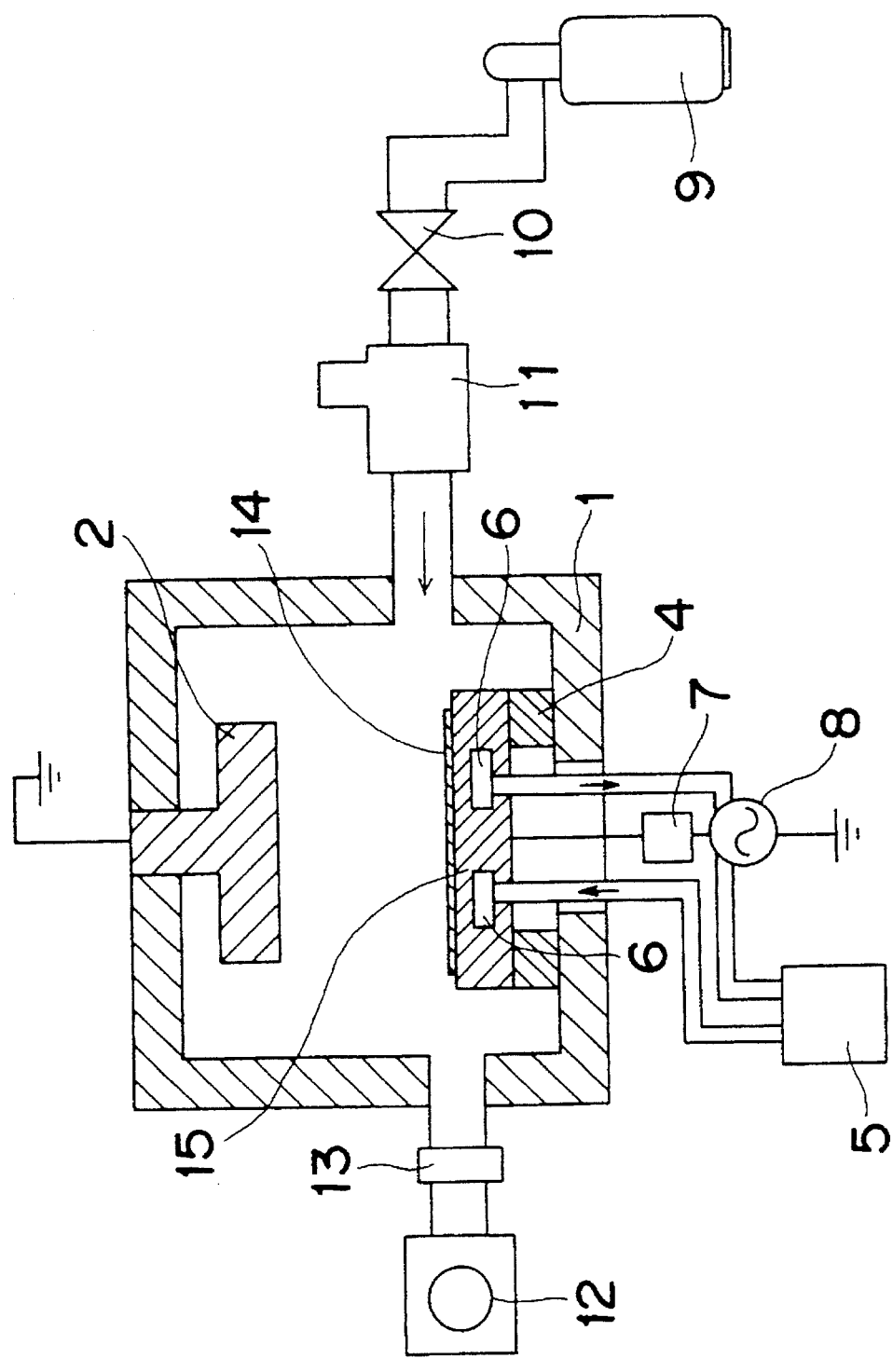
FIG. 1 is a schematic diagram of a dry etching apparatus in a preferred embodiment of the present invention.

Before the description of the present invention proceeds, it is to be noted that like parts are designated by like reference numerals throughout the accompanying drawings.

A dry etching apparatus in accordance with one preferred embodiment of the present invention will be discussed hereinbelow with reference to the accompanying drawings.

FIG. 1 is a diagram of an example of a reactive dry etching apparatus in an embodiment of the present invention.

Figure 2:
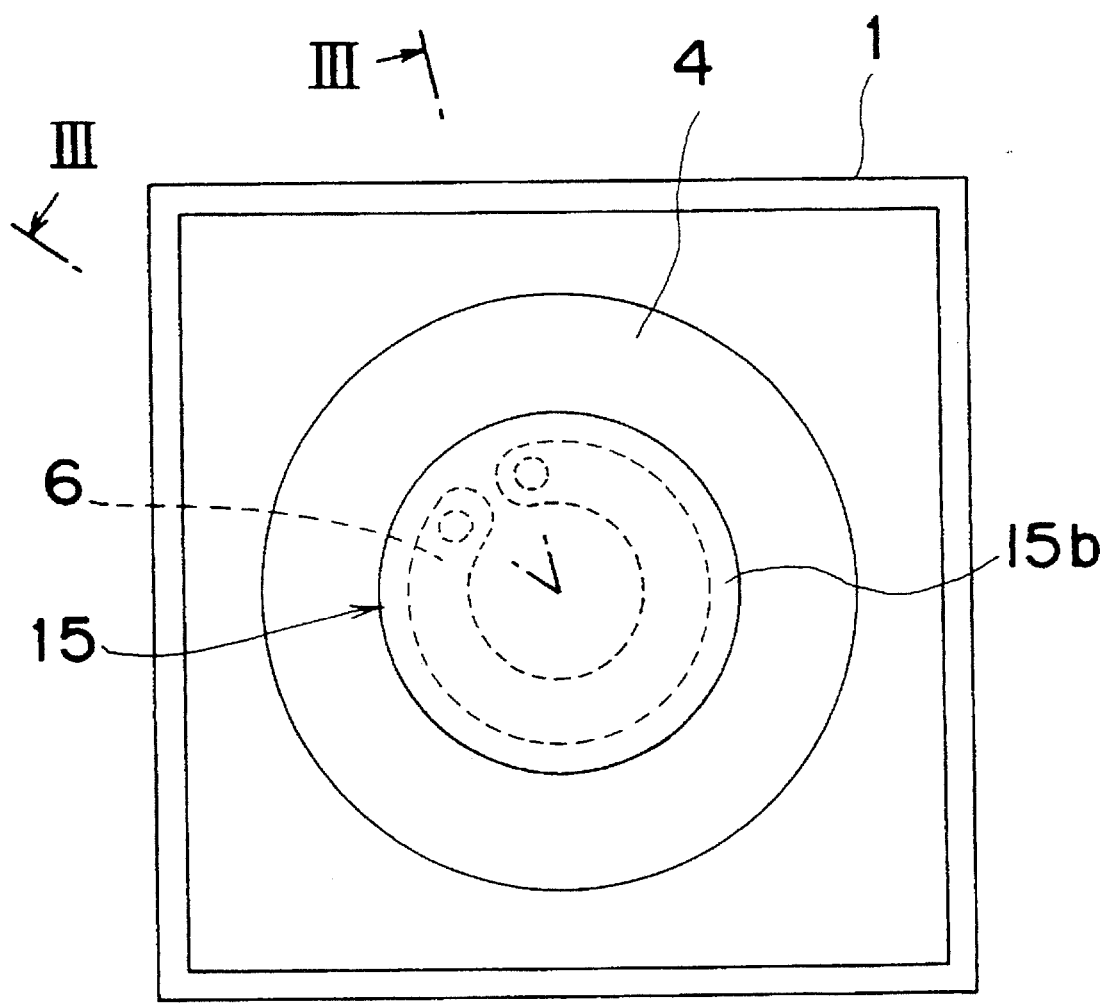
FIG. 2 is a plan view of an electrode in the dry etching apparatus of FIG. 1.
Figure 3:
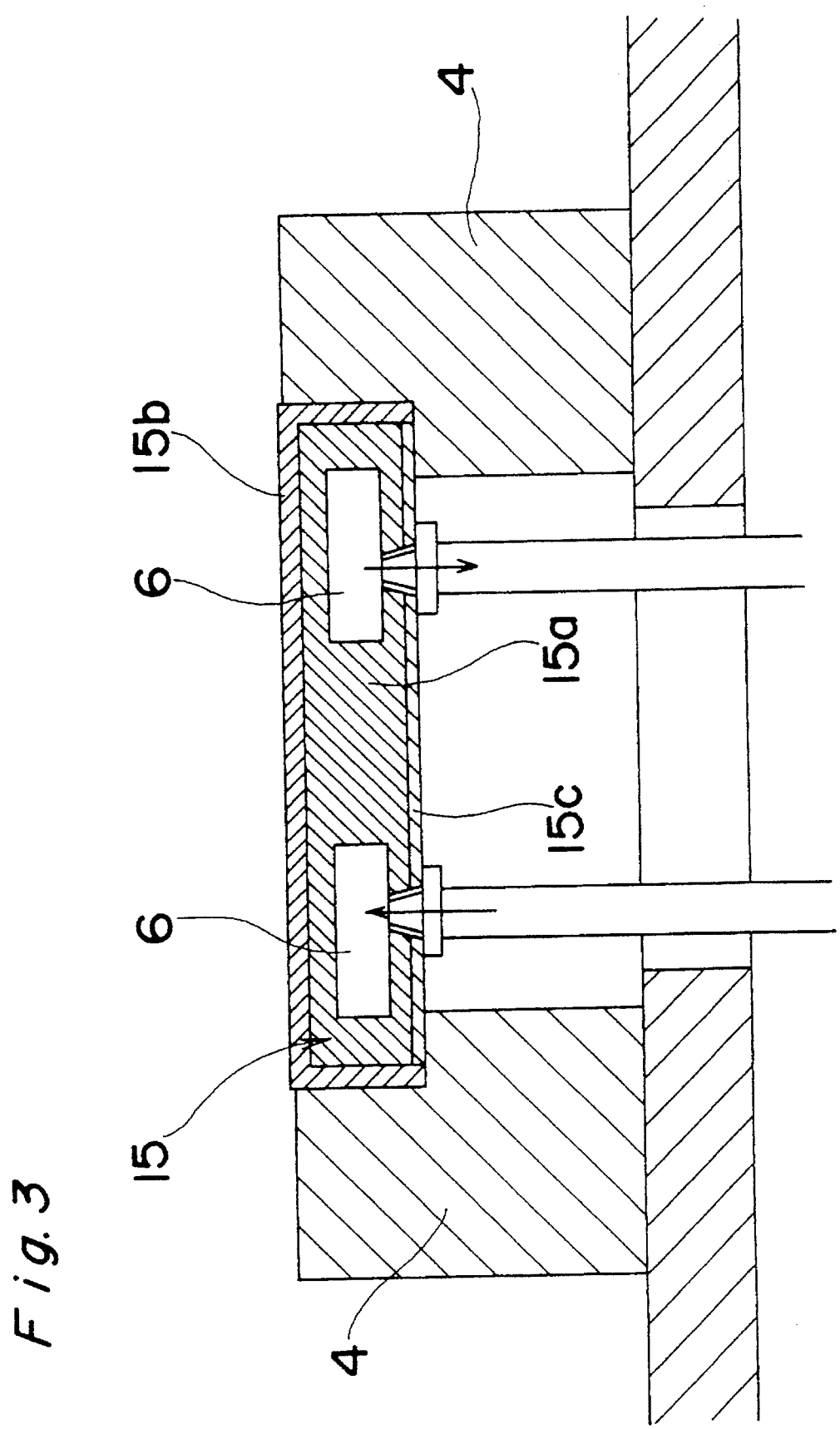
FIG. 3 is a schematic sectional view of the electrode in the dry etching apparatus of FIG. 1 taken along a line III—III in FIG. 2.
Figure 4:
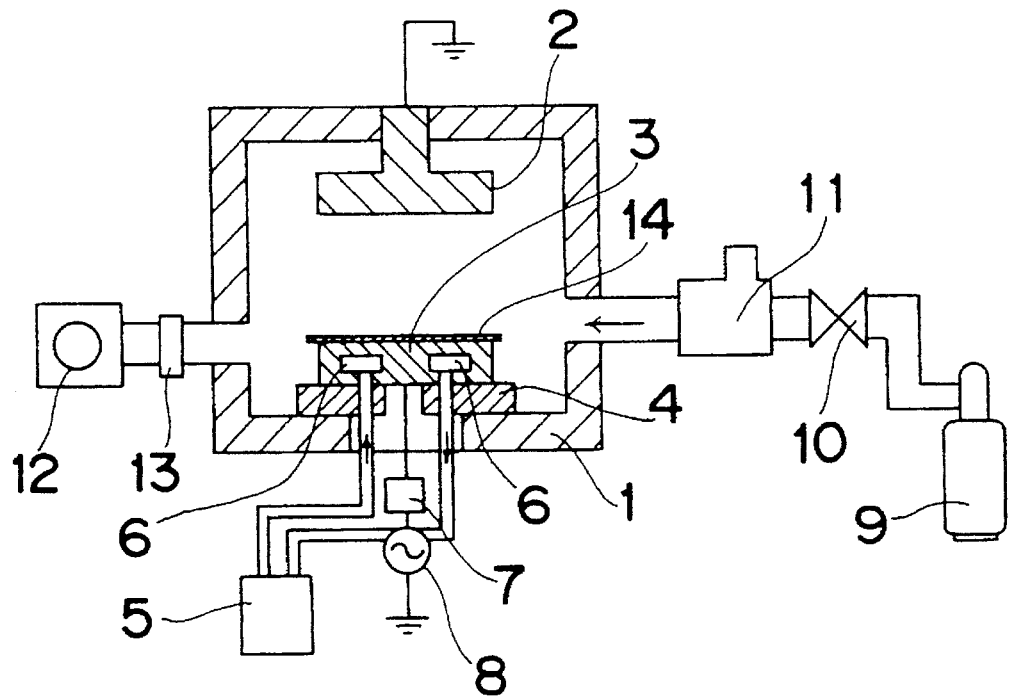
FIG. 4 is a schematic diagram of a conventional dry etching apparatus.
Figure 5:
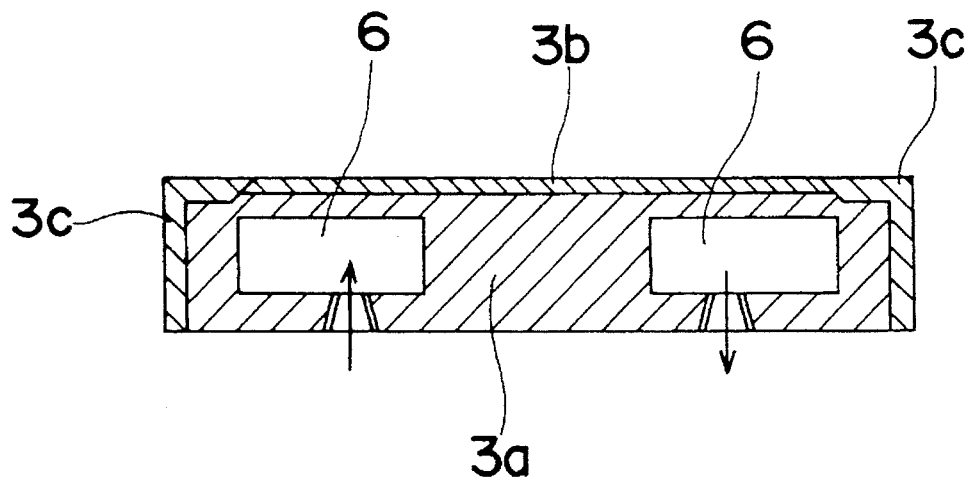
FIG. 5 is a schematic diagram of an electrode in the conventional dry etching apparatus.

The constitution of the dry etching apparatus in FIG. 1 is the same as in the conventional example of FIG. 4 except for a lower electrode 15. FIGS. 2 and 3 show diagrams of the lower electrode 15.

As shown in FIGS. 2 and 3, in the lower electrode 15, ceramic obtained by mixing titanium nitride with alumina and having a volume resistivity $\rho$ of a range: $1\times10^8\Omega\text{cm}<\rho 1\times10^9\Omega\text{cm}$ is plasma-sprayed to front and side surfaces of an aluminum base 15a in touch with a plasma and a semiconductor wafer 14 to form a ceramic layer 15b. The reason why the titanium nitride is mixed in the ceramic layer 15b is that, although titanium oxide has different volume resistivities depending on temperatures during plasma-spraying, titanium nitride has a stable volume resistivity irrelevant of temperature during plasma-spraying. If the volume resistivity $\rho$ is less than $1\times10^8\Omega\text{cm}$, semiconductor devices might be broken by leaked current. If the thickness of the ceramic layer 15b is less than 300 µm, the breakdown might occur or the electrostatic attraction force may not be produced. If the thickness of the ceramic layer 15b is more than 600 µm, the electrostatic attraction force may be weakened. The ceramic layer 15b has such a thickness as to resist the breakdown by plasma etching and attain the electrostatic attraction force of a size so as to not cause the semiconductor device to be damaged by the increased charges. Preferably, the thickness of the ceramic layer 15b is 300 through 600 µm, for example, 400 µm. The front surface of the electrode 15 in touch with the semiconductor wafer 14 is lapped to an average surface roughness of approximately 1 through 2 µm to enlarge the touching area. The other surface, i.e., rear surface of the lower electrode 15 is coated with an aluminum oxide film 15c.

The operation of the dry etching apparatus constructed as above will be described with reference to FIG. 1. The apparatus is provided with an upper electrode 2 and the lower electrode 15 in a vacuum chamber 1. The lower electrode 15 is held at a constant temperature since water is circulated in a passage 6 inside the lower electrode 15 by a water-circulating type of temperature control device 5. The lower electrode 15 is connected to a high frequency power source 8 for supplying alternating current via an impedance matching circuit 7, and accordingly a plasma is generated between the upper and lower electrodes 2 and 15.

Moreover, etching gas is guided into the vacuum chamber 1 through a valve 10 and a mass flow controller 11 from a steel gas cylinder 9. The gas is discharged outside by a vacuum pump 12. A pressure controller 13 maintains the pressure in the vacuum chamber 1 constant. The lower electrode 15 is provided in the vacuum chamber 1 via an insulating member 4.

When the predetermined etching gas is sent into the vacuum chamber 1 in a direction of an arrow from the 10 steel gas cylinder 9 through the valve 10 and the mass flow controller 11, and a high frequency power of the power source 8 is impressed from the lower electrode 15, the etching gas is turned to a plasma. The etching gas in the plasmatic state etches the to-be-etched semiconductor wafer 14 set on the lower electrode 15.

In the foregoing embodiment, during the plasma etching, the surface of the semiconductor wafer 14 is charged with negative electricity by cathode potential drop, and consequently the ceramic layer 15b of the lower electrode 15 is polarized. At this time, the electrostatic attraction force is generated between the lower electrode 15 and the semiconductor wafer 14, attracting the semiconductor wafer 14 to the lower electrode 15, whereby the temperature of the semiconductor wafer 14 is kept constant close to that of the lower electrode 15. However, since the lower electrode 15 is coated with the coating film of the ceramic layer 15b having such volume resistivity as eliminates the charges gradually, it is prevented that the surface of the semiconductor wafer 14 is charged further as etching is continued. The plasma-etched semiconductor device is accordingly obtained without being damaged by the increased charges. Moreover, since the electricity charged on the surface of the semiconductor wafer 14 by the lower electrode 15 is removed simultaneously when etching is completed, there is no residual electrostatic attraction force at all, so that the trouble during the transfer of the semiconductor wafer is hence solved.

Since the volume resistivity of the surface of the electrode is lowered, that is, the volume resistivity $\rho$ of the surface of the electrode is within a range: $1\times10^8\Omega\text{cm}\leq\rho<1\times10^9\Omega\text{cm}$ which is lower than $1\times10^{12}$ through $1\times10^{13}\Omega\text{cm}$ of the conventionally-employed alumina ceramic, the electrostatic attraction force is increased in conformity to the theorems of the Coulomb force and the Johnsen-Rahbeck Force. Not only the temperature of the semiconductor wafer is made controllable by the electrostatic adsorption force according to the present invention, but the semiconductor device is prevented from being damaged when charged increasingly or from troubles during transfer thereof due to the remaining electrostatic attraction force.

Although the present invention has been fully described in connection with the preferred embodiment thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A dry etching apparatus comprising:

a first electrode provided with means for controlling a temperature of a to-be-etched member;

a second electrode disposed facing in parallel to the first electrode;

a vacuum container housing the first and second electrodes therein;

means for feeding etching gas into the vacuum container; and means for impressing a high frequency power between the first and second electrodes, wherein a surface of the first electrode to be in touch with both the to-be-etched member and the etching gas and to which the high frequency power is impressed is coated with an insulating film of volume resistivity $\rho$ within a range: $1\times10^8\Omega\text{cm}\leq\rho 1\times10^9\Omega\text{cm}$.

2. The dry etching apparatus according to claim 1, wherein the surface of the first electrode is coated with alumina ceramic of volume resistivity $\rho$ within a range: $1\times10^8\Omega\text{cm}\leq\rho<1\times10^9\Omega\text{cm}$.

3. The dry etching apparatus according to claim 1, wherein the surface of the first electrode is lapped to have not larger than 5 µm average surface roughness.

4. The dry etching apparatus according to claim 2, wherein the surface of the first electrode is lapped to have not larger than 5 µm average surface roughness.

5. The dry etching apparatus according to claim 1, wherein alternating current is applied to the lower electrode by the high frequency power, and the surface of the first electrode is coated with a ceramic layer obtained by mixing titanium nitride with alumina and having a volume resistivity $\rho$ of a range: $1 \times 10^8 \Omega cm \leq \rho < 1 \times 10^9 \Omega cm$.

6. The dry etching apparatus according to claim 2, wherein alternating current is applied to the lower electrode by the high frequency power, and the surface of the first electrode is coated with a ceramic layer obtained by mixing titanium nitride with alumina and having a volume resistivity $\rho$ of a range: $1 \times 10^8 \Omega cm \leq \rho < 1 \times 10^9 \Omega cm$.

7. The dry etching apparatus according to claim 3, wherein alternating current is applied to the lower electrode by the high frequency power, and the surface of the first electrode is coated with a ceramic layer obtained by mixing titanium nitride with alumina and having a volume resistivity $\rho$ of a range: $1 \times 10^8 \Omega cm \leq \rho < 1 \times 10^9 \Omega cm$.

8. The dry etching apparatus according to claim 4, wherein alternating current is applied to the lower electrode by the high frequency power, and the surface of the first electrode is coated with a ceramic layer obtained by mixing titanium nitride with alumina and having a volume resistivity $\rho$ of a range: $1 \times 10^8 \Omega cm \leq \rho < 1 \times 10^9 \Omega cm$.

\* \* \* \* \*